United States Patent
Lam et al.

(10) Patent No.: US 7,872,889 B2
(45) Date of Patent: Jan. 18, 2011

(54) HIGH DENSITY TERNARY CONTENT ADDRESSABLE MEMORY

(75) Inventors: Chung H. Lam, Peekskill, NY (US); Bipin Rajendran, White Plains, NY (US)

(73) Assignee: International Business Machines Corporation, Armonk, NY (US)

(*) Notice: Subject to any disclaimer, the term of this patent is extended or adjusted under 35 U.S.C. 154(b) by 84 days.

(21) Appl. No.: 12/427,484

(22) Filed: Apr. 21, 2009

(65) Prior Publication Data

US 2010/0265748 A1   Oct. 21, 2010

(51) Int. Cl.
*G11C 15/00* (2006.01)

(52) U.S. Cl. .................. 365/49.17; 365/49.1; 365/148; 365/168

(58) Field of Classification Search .............. 365/49.17, 365/168
See application file for complete search history.

(56) References Cited

U.S. PATENT DOCUMENTS

| | | | |
|---|---|---|---|
| 7,050,316 B1 | 5/2006 | Lin et al. ...................... 365/49 |
| 7,130,206 B2 | 10/2006 | Ferrant ........................ 365/49 |
| 7,227,765 B2 | 6/2007 | De Sandre et al. ............ 365/49 |
| 7,319,608 B2 | 1/2008 | Hsu et al. .................... 365/163 |
| 7,499,303 B2 * | 3/2009 | Lien et al. ..................... 365/50 |
| 2007/0097740 A1 | 5/2007 | Derhacobian et al. ....... 365/163 |
| 2008/0068872 A1 | 3/2008 | Lee et al. ................. 365/49.17 |

FOREIGN PATENT DOCUMENTS

| | | |
|---|---|---|
| EP | 0230304 A2 | 7/1987 |
| EP | 1526547 | 4/2005 |

OTHER PUBLICATIONS

Kostas Pagiamtzis et al., "Content-Addressable Memory (CAM) Circuits and Architectures: A Tutorial and Survey" IEEE Journal of Solid-State Circuits, vol. 41, No. 3 (Mar. 2006).

* cited by examiner

*Primary Examiner*—Tan T. Nguyen
(74) *Attorney, Agent, or Firm*—Ido Tuchman; Vazken Alexanian

(57) ABSTRACT

A content addressable memory device with a plurality of memory cells storing data words. Each data bit in the data words is set to one of three values of a first binary value, a second binary value, and a don't care value. An aspect of the content addressable memory device is the use of a single memory element and an access device in the memory cells. The memory cells are arranged such that each memory cell is electrically coupled to a single bit line, a single match line, and a single word line. The memory elements in the memory cells store low resistance states if the data bit value is the first binary value, high resistance states if the data bit value is the second binary value, and very high resistance states if the data bit value is the don't care value.

25 Claims, 5 Drawing Sheets

| Stored Data Bit Value/Memory Element Resistance State: | Search Bit Value/Access Device Resistance State: | Result/Match Line Resistance: |
|---|---|---|
| 1st Binary Value/Low Resistance State | 1st Binary Value/High Resistance State | Match/Medium Collective Resistance |
| 2nd Binary Value/High Resistance State | 2nd Binary Value/Low Resistance State | Match/Medium Collective Resistance |
| 1st Binary Value/Low Resistance State | 2nd Binary Value/Low Resistance State | No Match/Low Collective Resistance |
| 2nd Binary Value/High Resistance State | 1st Binary Value/High Resistance State | No Match/High Collective Resistance |
| Don't Care Value/Very High Resistance State | 2nd Binary Value/Low Resistance State | Match/Very High Collective Resistance |
| Don't Care Value/Very High Resistance State | 1st Binary Value/High Resistance State | Match/Very High Collective Resistance |

Fig. 3

HIGH DENSITY TERNARY CONTENT ADDRESSABLE MEMORY

BACKGROUND OF THE INVENTION

1. Field of the Invention

The present invention relates to programming content addressable memory utilizing phase change memory and an access transistor.

2. Description of Background

Content addressable memory (CAM) is a type of computer memory utilized in high speed searching applications. Most CAM devices utilize static random access memory (SRAM) as data storage devices (utilizing transistors to store memory), and additional transistors and complementary transistors for match operations. Often in these CAM devices search-line access elements and word-line access elements are necessary to operate and program individual memory cells in the memory arrays. These search-line access elements and word-line access elements are often comprised of power intensive large drive field effect transistors (FET).

Phase change material can also be utilized to store memory for CAM devices. Information is stored in materials that can be manipulated into different phases. Each of these phases exhibits different electrical properties that can be used for storing information. The varying ratios of the amorphous and crystalline phases have detectable differences in electrical resistance. Specifically, the greater the ratio of amorphous phase, the higher the resistance.

Chalcogenides are a group of materials commonly utilized as phase change material. They typically contain a chalcogen (Periodic Table Group 16/VIA) and a more electropositive element. Selenium (Se) and tellurium (Te) are the two most common semiconductors in the group used to produce a chalcogenide when creating a phase change memory cell. An example of this is $Ge_2Sb_2Te_5$ (GST), SbTe, and $In_2Se_3$. However, some phase change materials do not utilize chalcogen, such as GeSb. Thus, a variety of materials can be used in a phase change material cell.

Two problems in phase change CAM devices and standard CAM devices are the size of individual memory cells in the memory devices (requiring complementary access transistors and complementary memory elements) and the amount of information a phase change memory cell can store. Thus, it is desirable to devise a CAM configuration to reduce the size of the individual memory cells and to be able to store a greater amount of information.

SUMMARY OF THE INVENTION

One aspect of the invention is a method for operating a content addressable memory array. The method includes receiving a data word for storage in the content addressable memory array. Each data bit of the data word is set to one of three values of a first binary value, a second binary value, and a don't care value. For each data bit in the data word, the method includes programming a memory element in a memory cell corresponding to the data bit. The memory cell is programmed to a low resistance state if a value of the data bit is the first binary value, to a high resistance state if the value of the data bit is the second binary value, and to a very high resistance state if the value of the data bit is the don't care value. Additionally, the high resistance state is at least one order of magnitude higher in resistance than the low resistance state and the very high resistance state is at least one order of magnitude higher in resistance than the high resistance state.

Another aspect of the invention is a computer program product embodied in a computer usable memory. The computer usable memory includes computer readable program codes coupled to the computer usable medium for operating a content addressable memory array. The computer readable program codes are configured to cause the program to receive a data word for storage in the content addressable memory array. Each data bit of the data word is set to one of three values of a first binary value, a second binary value, and a don't care value. For each data bit in the data word, the computer readable program codes are configured to cause the program to program a memory element in a memory cell corresponding to the data bit. The memory cell is programmed to a low resistance state if a value of the data bit is the first binary value, to a high resistance state if the value of the data bit is the second binary value, and to a very high resistance state if the value of the data bit is the don't care value. Additionally, the high resistance state is at least one order of magnitude higher in resistance than the low resistance state and the very high resistance state is at least one order of magnitude higher in resistance than the high resistance state.

Another aspect of the invention is a content addressable memory device. The content addressable memory device includes a plurality of memory cells combined to store data words. Each memory cell includes a memory element electrically coupled to an access device in series circuit. The memory element is configured to store a first binary value as a low resistance state, a second binary value as a high resistance state, and a don't care value as a very high resistance state. The high resistance state is at least one order of magnitude higher in resistance than the low resistance state and the very high resistance state is at least one order of magnitude higher in resistance than the high resistance state. The content addressable memory device also includes a search driver unit. The search driver unit is configured to, during a search operation, bias the access device of each memory cell. The access device of each memory cell is biased such that the effective resistance of the access device is a low resistance state if the value of the corresponding bit of the search word is the second binary value, and is a high resistance state if the value of the corresponding bit of the search word is the first binary value. Additionally, the high resistance state is at least one order of magnitude higher in resistance than the low resistance state.

Yet another aspect of the invention is a memory cell in a content addressable memory array for storing a ternary data bit. The value of the ternary data bit is one of a first binary value, a second binary value, and a don't care value. The memory cell includes a memory element. The memory element is configured to store a low resistance state if the value of the ternary data bit is the first binary value, a high resistance state if the value of the ternary data bit is the second binary value, and a very high resistance state if the value of the ternary data bit is the don't care value. The high resistance state is at least one order of magnitude higher in resistance than the low resistance state and the very high resistance state is at least one order of magnitude higher in resistance than the high resistance state. The memory cell also includes an access device electrically coupled to the memory element in series circuit.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 3 illustrates a truth table for search operations.

DETAILED DESCRIPTION OF THE INVENTION

The present invention is described with reference to embodiments of the invention. Throughout the description of the invention reference is made to FIGS. 1-4.

As described in detail below, an embodiment of the current invention is a single element content addressable memory device for storing ternary data words. Each data bit in a data word is settable to one of three values of a first binary value (i.e., a "0" or low value), a second binary value (i.e., a "1" or high value), and a don't care value (i.e., a "X" value). The content addressable memory device is comprised of a plurality of memory cells. Each individual memory cell includes a memory element and an access device electrically coupled in series circuit to the memory element. Additionally, each access device is electrically coupled to a single word line and a single match line. Each memory element is electrically coupled to a single bit line.

In a particular configuration of the invention, the memory elements are phase change elements comprised of a phase change material, such as Germanium-Antimony-Tellurium (GST). Phase change materials can be set to comprise varying ratios of crystalline to amorphous material. In one particular embodiment of the invention, the memory elements may be programmed to one of three states: a low resistance state, a high resistance state, and a very high resistance state. Each resistance state represents one of the three data bit values. For example, the low resistance state may represent the first (low) binary value, the high resistance state represents the second (high) binary value, and the very high resistance state represents the don't care value.

In phase change memory, the low resistance state is comprised primarily of crystalline phase change material. The high resistance state is comprised of a mixture of crystalline and amorphous phase change material. The very high resistance state is comprised primarily of amorphous phase change material. It is noted that other embodiments of the present invention are not limited to memory elements comprising of phase change material.

Figure 1:
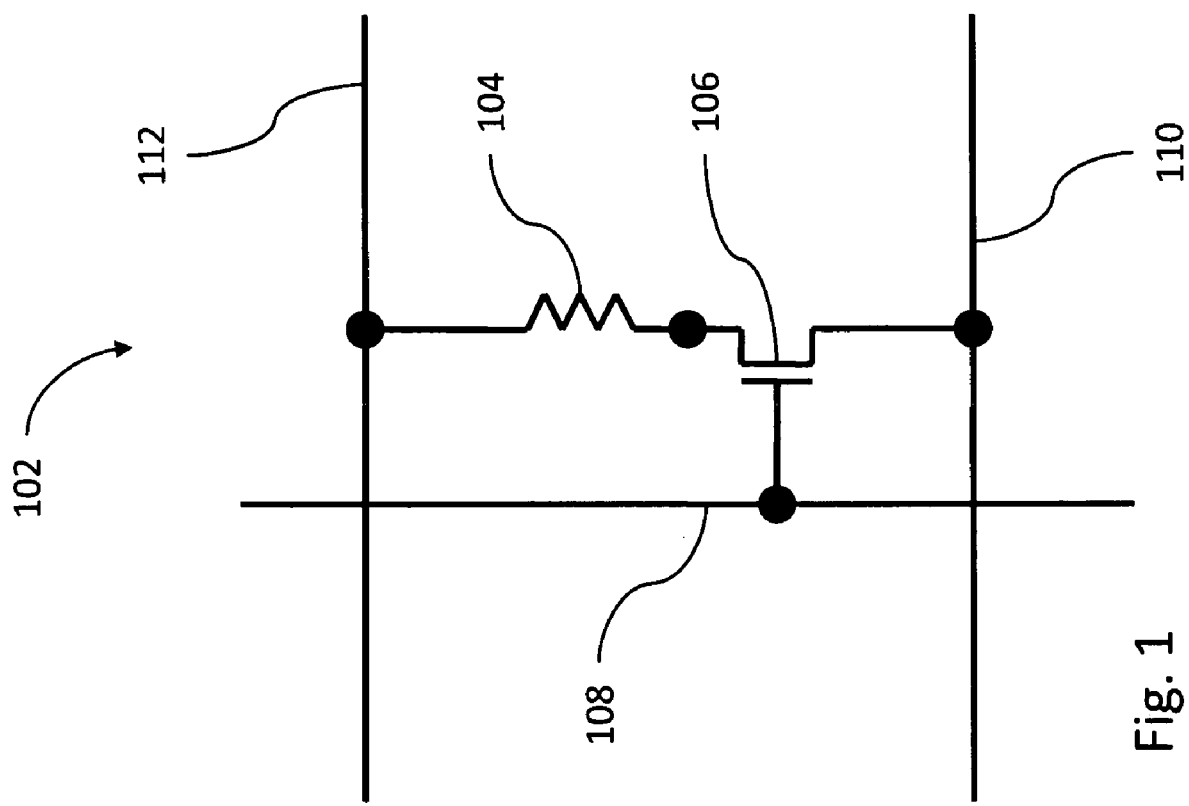
FIG. 1 illustrates a memory cell.

In FIG. 1, an individual memory cell 102 contemplated by one embodiment of the present invention is shown. The memory cell 102 includes a memory element 104 and an access device 106. The memory element 104 and the access device 106 are electrically coupled in series circuit, as shown. The memory element 104 may be comprised of, but not limited to, phase change memory elements, resistive memory elements, floating gate field effect transistors (floating gate FETs), Magnetoresistive Random Access Memory (MRAM), or charge trapping devices. The access devices 106 may be comprised of, but not limited to, field effect transistors (FETs), or bipolar junction transistors (BJTs).

As stated above, the memory cell 102 stores a ternary data value as one of three resistance states. In other words, the memory cell 102 may store the first binary value with the low resistance state, the second binary value with the high resistance state, and the don't care value with the very high resistance state. In one embodiment of the invention, the high resistance state is at least one order of magnitude higher in resistance than the low resistance state and the very high resistance state is at least one order of magnitude higher in resistance than the high resistance state.

Also shown in FIG. 1 are a word line 108, a match line 110, and a bit line 112. The word line 108 and the match line 110 are electrically coupled to the access device 106. The bit line 112 is electrically coupled to the memory element 104. The word line 108 is used to bias the access device 106 during both programming and search operations. The match line 110 acts as the source terminal during programming operations and is used for current/resistance sensing during search operations. The bit line 112 is used to provide current for program and search operations.

During programming operations, a voltage pulse applied to the bit line 112 is set to a full programming voltage. In one embodiment of the invention, the bit line 112 is set to a voltage that is high enough to change the phase change elements to a fully amorphous state (very high resistance). The word line 108 is biased to turn on the access device 106. A suitable current or voltage pulse is then applied to the bit line 112 to program the memory element 104 to the desired resistance state. In an alternate embodiment of the invention, full programming current or voltage pulse is applied to the bit line 112 and the access device 106 is turned on by the word line 108 to allow a suitable current or voltage pulse across the memory element 104.

In one embodiment of the invention, a current pulse passing through the memory cell 102 during the programming operation causes phase change material in the memory element 104 to heat and change its crystalline structure. The type of current pulse applied by the bit line 112 is determined by the resistance state to be programmed. For example, to program a phase change memory element 104 to the low resistance state, the bit line 112 pulse has a gradual trailing edge so that the phase change material is allowed to gradually cool and fully crystallize (or at least mostly crystallized). To program the phase change memory element 104 to the high resistance state, the bit line 112 pulse has an intermediate trailing edge so that the phase change material is allowed to partially crystallize leaving a partially amorphous, partially crystalline phase change memory element 104. To program the phase change memory element 104 to the very high resistance state, the bit line 112 pulse has an abrupt trailing edge so that the phase change material cools into a fully amorphous state (or at least mostly amorphous state).

During search operations, a search bit is compared with the stored data bit. The bit line 112 is set to a full search voltage. The word line 108 biases the access device 106 to a low effective resistance state if the search bit value is the second binary value, and to a high effective resistance state if the search bit value is the first binary value. In one embodiment of the invention the high effective resistance state is at least one order of magnitude higher in resistance than the low effective resistance state. The match line 110 senses the collective effective resistance of the memory element 104 and the access device 106. In another embodiment of the invention, the match line 110 senses the current passing through the memory element 104 and access device 106.

Figure 2:
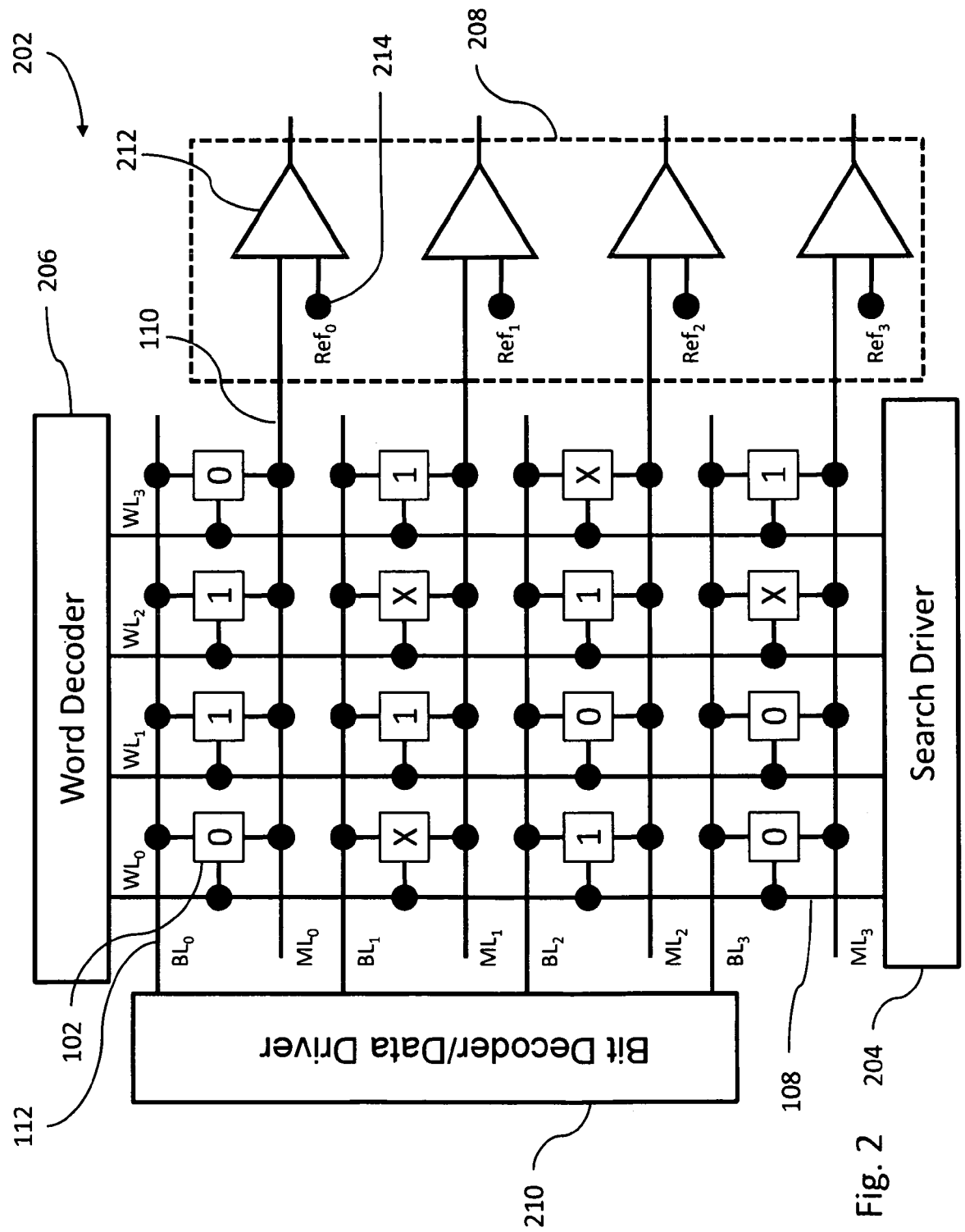
FIG. 2 illustrates a content addressable memory device.

Now turning to FIG. 2, the content addressable memory device 202 is illustrated. The content addressable memory device 202 includes a plurality of memory cells 102, a plurality of word lines 108, a plurality of match lines 110, a plurality of bit lines 112, a search driver unit 204, a word decoder unit 206, a matching unit 208, and a bit decoder/data driver unit 210.

For each data word stored in the content addressable memory device 202, the memory elements in the plurality of memory cells 102 storing the data word are electrically coupled in parallel circuit to a single bit line 112. The access devices in the plurality of memory cells 102 storing the data word are electrically coupled in parallel circuit to a single match line 110. The access devices in the same digit locations of data words are electrically coupled to a single word line in parallel circuit.

During programming operations, the content addressable memory device 202 receives a data word containing data bits to be programmed to the content addressable memory device 202. The word decoder unit 206 turns on the access device to each memory element sequentially by applying a voltage to the word lines 108. Depending on the data bit to be stored in the memory element, the bit decoder/data driver unit 210 applies voltage or current pulses to the bit lines 112. The current from the bit line 112 discharges through the memory elements and the access devices and to the match line 110. As stated above, the applied current programs the memory elements to the low resistance state if a value of the corresponding bit in the data word is the first binary value. The applied current programs the memory elements to the high resistance state if the value of the corresponding bit in the data word is the second binary value. The applied current programs the memory elements to the very high resistance state if the value of the corresponding bit in the data word is the don't care value.

During search operations, the content addressable memory device 202 receives a search word containing search bits to be compared to the data bits stored in the plurality of memory cells 102. The search driver unit 204 biases the access device of each memory cell 102 in the content addressable memory device 202 such that the effective resistance of the access device is the low resistance state if the value of the corresponding bit of the search word is the second binary value, and is the high resistance state if the value of the corresponding bit of the search word is the first binary value. The bit decoder/data driver unit 210 sets all bit lines 112 to the search voltage. Once the bit line voltages are set, the bit line 112 currents discharge through the memory cells 102 and the match lines 110 to the matching unit 208. The matching unit 208 senses the resistance or current of the match lines 110 and indicates the match locations.

In FIG. 3, a truth table 302 is shown, in accordance with an embodiment of the invention, for search operations. The table 302 illustrates the stored data bit values and the resistance states stored in the memory element 304, search bit values and the resistance states of the access device 306, and the result and the match line resistance 308. As shown, a search match 310 is indicated if the match line resistance (collective effective resistance of the memory element and access device) is very high or medium. No match 312 is indicated if the match line resistance is high or low. For example, the resistance states settable for the memory element and access device are 10 K ohms for the low resistance state, 100 K ohms for the high resistance state, and 1000 K ohms for the very high resistance state (note that the values are only illustrative). If the memory element is storing the first binary value or the second binary value then a search match 310 is indicated if the collective effective resistance of the memory element and the access device is 110 K ohms. If the memory element is storing the don't care state then a search match is indicated if the collective effective resistance is 1100 K ohms or 1010 K ohms. Therefore, during search operations for a plurality of memory cells, the search match 310 values vary with the number of memory elements storing the don't care state. Additionally, a predetermined resistance/current range centered on a match resistance (or current) value is created instead of an exact value to account for deviations during programming and manufacturing processes.

Turning back to FIG. 2, in one embodiment of the invention, the match unit 208 includes a comparator 212 for each match line 110 and a predetermined resistance/current range 214 (shown as $Ref_0$, $Ref_1$, $Ref_2$, and $Ref_3$) corresponding to each match line 110. The predetermined resistance/current range 214 can be stored in memory—either on chip or off chip. Furthermore, the stored range 214 can be stored as either a binary word in digital memory or an analog value stored in analog memory. Examples of digital memory include SRAM, DRAM, and FLASH memory. An example of analog memory is a single phase change memory cell storing analog data as a ratio of amorphous-to-crystalline phase change material. Those skilled in the art will recognize that a variety of other technologies and devices may be utilized to store the predetermined resistance/current range 214 for each match line 110.

In one particular embodiment of the invention, the predetermined resistance/current range 214 is centered on the match resistance value determined by $rR/(nR+zr)$, where "r" is the collective effective resistance of the high resistance state of an individual memory element and the low resistance state of an individual access device (and vice versa), "R" is the collective effective resistance of the very high resistance of the individual memory element and the high or low resistance state of an individual access device, "n" is the number of first or second binary values stored for an individual data word, and "z" is the number of don't care values stored in the individual data word. In one embodiment of the invention where the very high resistance state is at least one order of magnitude greater in resistance than the high resistance state, "R" can be equal to the very high resistance state since measurements of "R" will not differentiate between deviations in resistances less than one order of magnitude in resistance. In an alternate embodiment of the invention, the predetermined resistance/current range 214 is centered on the match current value. The predetermined resistance/current range 214 for each individual data word stored is then stored in the corresponding analog storage device.

An example of a search operation, in accordance with FIG. 2 and the example resistance states stated above, is matching search word "1011" ("0" is the first binary value and "1" is the second binary value, note that the values are only illustrative) to the data words stored in the content addressable memory device 202. In this example, the content addressable memory device 202 receives "1011" as the search word. The search driver 204 sets the voltage in the first ($WL_0$), third ($WL_3$), and fourth ($WL_3$) word lines 108 to bias the access devices to the low resistance state (10 K ohms). The search driver 204 sets the voltage in the second word line ($WL_1$) 108 to bias the access devices to the high resistance state (100 K ohms). The bit decoder/data driver unit 210 sets all four bit lines 112 to the search voltage. The current from the four bit lines ($BL_0$-$BL_3$) 112 discharges through all the memory cells 102, through all four match lines ($ML_0$-$ML_3$) 110, and to the four comparators 212 in the matching unit 208.

The comparators 212 compare each match line 110 current (or resistance) to the match line's 110 corresponding predetermined resistance/current range 214. In accordance with FIG. 2 and the example resistance states stated above, a search match is indicated if the collective effective resistance is approximately 28 K ohms for the first match line 110, 55 K ohms for the second match line 110, and 37 K ohms for the third and fourth match lines 110. The actual resistances of the match lines 110 during the search operation are 8.8 K ohms for the first match line 110, 62.2 K ohms for the second match line 110, 35.4 K ohms for the third match line 110, and 14.5 K ohms for the fourth match line 110. In this example, the matching unit 208 would indicate a search match on the third match line 110. In an alternate embodiment of the invention, the collective currents are measured and a search match is indicated if the collective current of a match line 110 is within a predetermined current range 214. Those skilled in the art will recognize that a variety of processes may be utilized for the comparators 212 to compare the match line currents (or resistances) to the predetermined resistance/current ranges 214 stored in memory. One solution can be to apply a search current through phase change memory cells utilized as analog memory to store the predetermined resistance/current ranges 214 coupled to the comparators 212. In this example, the comparators 212 compare the currents through the match lines 110 and the currents through the resistors coupled to the comparators 212.

Figure 4A:
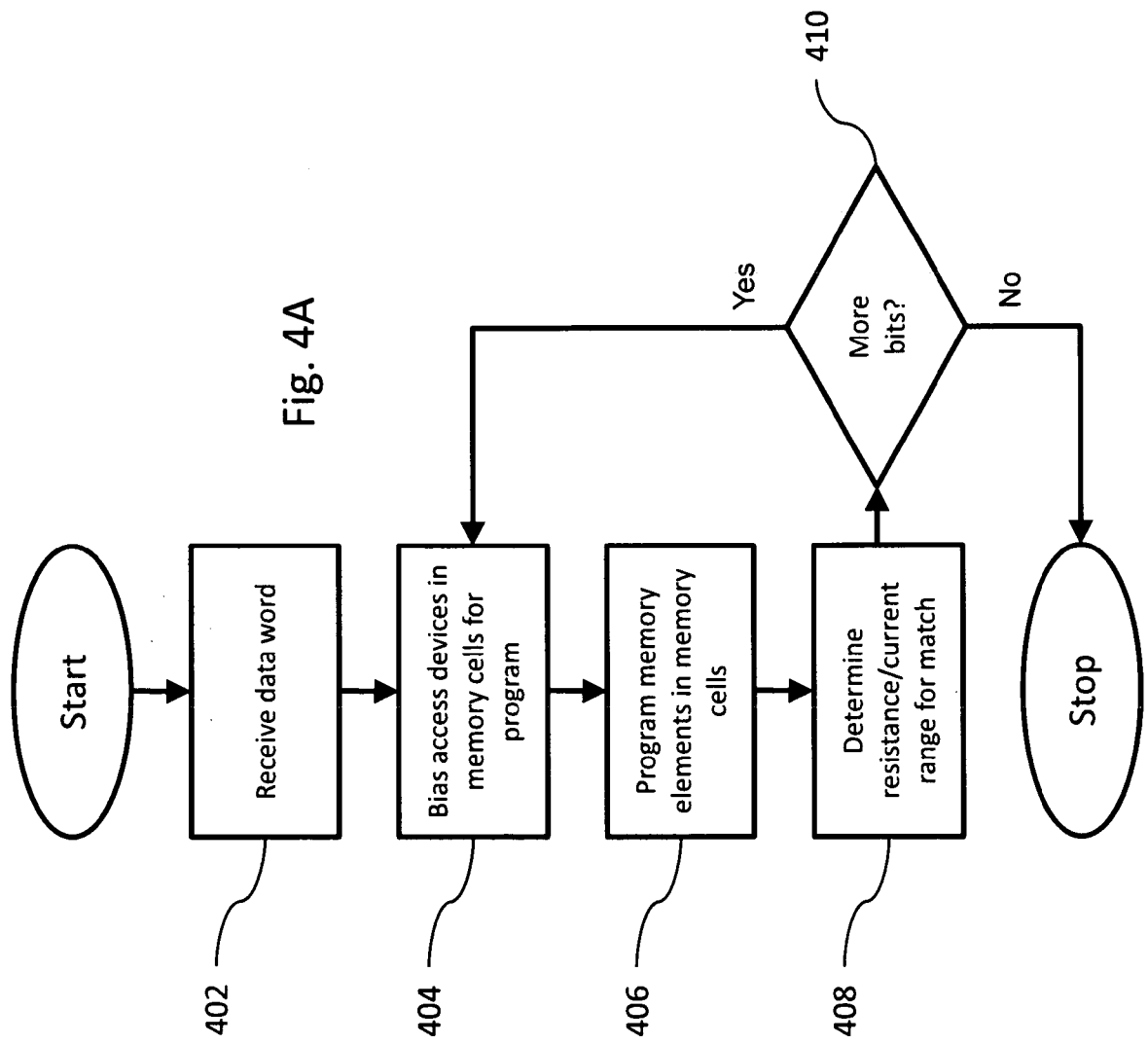
FIGS. 4A and 4B illustrate a process flow for the method.

FIG. 4A illustrates a method for programming a content addressable memory device contemplated by an embodiment of the present invention. The process flow begins at receiving operation 402. During receiving operation 402, a data word or a collection of data words is received by the content addressable memory device. The data word contains a string of data bit values. Each data bit value is set to one of three values: a first binary value (i.e., "0"), a second binary value (e.g., "1"), and a don't care value (i.e., "X" or don't care). Each data bit value is stored at a corresponding memory cell on an individual match line and bit line. After receiving operation 402 is completed, control passes to biasing operation 404.

During biasing operation 404, the word decoder applies a bias voltage to the word line corresponding to the next memory cell to be programmed. The bias voltage turns on the access device of the memory cell. After biasing operation 404 has been completed, control passes to programming operation 406.

During programming operation 406, the bit decoder/data driver applies a voltage pulse to the bit line corresponding to the memory cell to be programmed. The resulting current passes through the memory cell's memory element and programs the memory element to one of the three resistance states representing the three possible bit values (0, 1 or don't care). As mentioned above, the three resistance states are a low resistance state corresponding to the first binary value, the high resistance state corresponding to the second binary value, and the very high resistance state corresponding to the don't care value. Consequently, the memory element is programmed to a resistance state corresponding to the value of the data bit to be stored. After programming operation 406, control passes to determining operation 408.

During determining operation 408, the resistance/current range corresponding to a perfect match is determined. As discussed above, an embodiment of the invention uses the equation rR/(nR+zr) to determine the resistance/current range. In this equation, "r" is the collective effective resistance of the high resistance state of an individual memory element and the low resistance state of an individual access device (and vice versa), "R" is the collective effective resistance of the very high resistance of the individual memory element and the high or low resistance state of an individual access device, "n" is the number of first or second binary values stored for an individual data word, and "z" is the number of don't care values stored in the individual data word. Consequently, the predetermined resistance/current range is determined by the number of memory cells storing either the first or second binary values, and the number of memory cells storing the don't care value. The predetermined resistance/current range is centered on the match resistance value. In an alternate embodiment of the invention, the predetermined resistance/current range is centered on the match current value. The predetermined resistance/current range is then stored in memory.

As mentioned above, the match current value or match resistance value calculated in determining operation 208 is stored in computer memory. This value is retrieved during a search operation, as discussed below, to resolve search matches. After determining operation 408 is completed, control passes to decision operation 410.

At decision operation 410, a determination is made as to whether or not there are more data bits in the received data word that require storage. If the data word has more data bits to be stored then control passes back to biasing operation 404. If the data word does not have any more data bits for storage then the process flow ends.

Figure 4B:
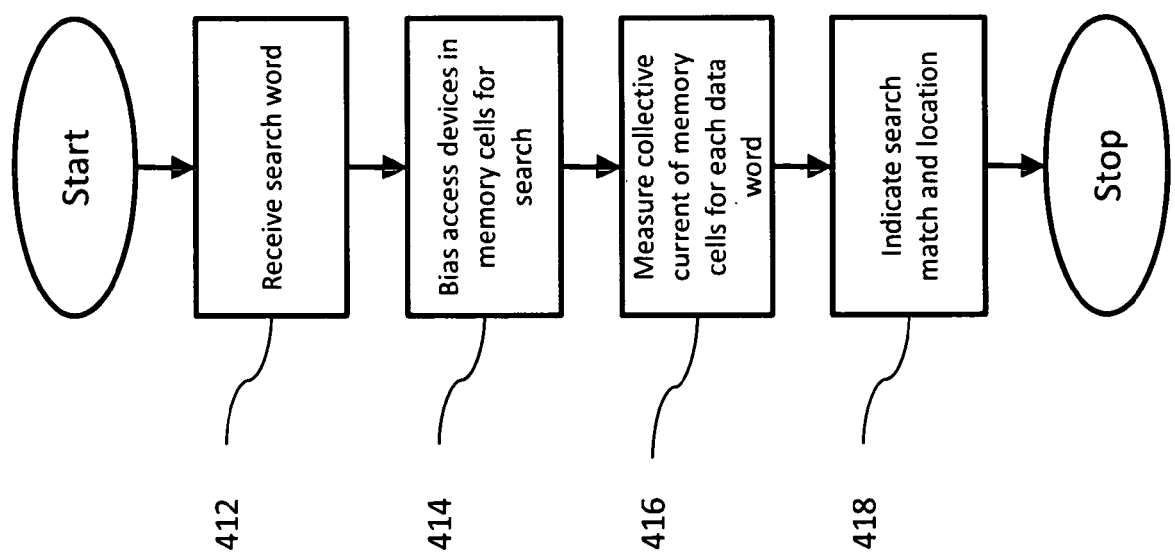

FIG. 4B illustrates a method for searching a content addressable memory device contemplated by an embodiment of the present invention. The process flow begins at receiving operation 412. During receiving operation 412, the content addressable memory device receives the search word. The search word contains search bits with one of two values of the first binary value, and the second binary value. Each search bit corresponds to a digit location of the data bits in the data words stored in the content addressable memory device. After receiving operation 412 is completed, control passes to biasing operation 414.

During biasing operation 414, the search driver unit sets the voltage in all the word lines such that the effective resistance of the access devices are the low resistance state if the value of the corresponding bit of the search word is the second binary value, and are the high resistance state if the value of the corresponding bit of the search word is the first binary value. After biasing operation 414 is completed, control passes to measuring operation 416.

During measuring operation 416, the bit decoder/data driver applies a search voltage to every bit line and the matching unit measures the collective effective resistance of every match line. In an alternate embodiment of the invention, the matching unit measures the collective current of every match line. After measuring operation 416 is completed, control passes to indicating operation 418.

During indicating operation 418, the matching unit indicates a search match and the location of the search match. The search match is indicated if the collective effective resistance of a particular match line is within the predetermined resistance/current range stored in memory during the programming operations. Again, in an alternate embodiment of the invention, the search match is indicated if the collective current of a particular match line is within the predetermined resistance/current range stored in memory during the programming operations. After indicating operation 418 is completed the process flow ends.

Those skilled in the relevant art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans can implement the described functionality in varying ways for each particular application, but such implementation decisions should not be interpreted as causing a departure from the scope of the present invention.

The various illustrative logical blocks, modules, and circuits described in connection with the embodiments disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, conventional processor, controller, microcontroller, state machine, etc. A processor can also be implemented as a combination of computing devices, e.g., a combination of a DSP and a microprocessor, a plurality of microprocessors, one or more microprocessors in conjunction with a DSP core, or any other such configuration. In addition, the term "processing" is a broad term meant to encompass several meanings including, for example, implementing program code, executing instructions, performing arithmetic operations, and the like.

Having described preferred embodiments for the content addressable memory device (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for operating a content addressable memory array, the method comprising:
   receiving a data word for storage in the content addressable memory array, each data bit of the data word being set to one of three values of a first binary value, a second binary value, and a don't care value; and
   for each data bit in the data word, programming a memory element in a memory cell corresponding to the data bit to a low resistance state if a value of the data bit is the first binary value, to a high resistance state if the value of the data bit is the second binary value, and to a very high resistance state if the value of the data bit is the don't care value, the high resistance state being at least one order of magnitude higher in resistance than the low resistance state and the very high resistance state being at least one order of magnitude higher in resistance than the high resistance state.

2. The method of claim 1, further comprising biasing a bit line coupled to the memory element such that the current through the bit line programs the memory element to the low resistance state if the value of the corresponding data bit in the data word is the first binary value, the high resistance state if the value of the corresponding data bit in the data word is the second binary value, and the very high resistance state if the value of the corresponding data bit in the data word is the don't care value.

3. The method of claim 1, further comprising:
   receiving a search word for search through the data words stored in the content addressable memory array, wherein bit locations of the search word correspond to bit locations of the stored data words; and
   for each search bit in the search word, biasing an access device electrically coupled to the memory element corresponding to the search bit to a low resistance state if a value of the search bit is the second binary value and to a high resistance state if the value of search bit is the first binary value, the high resistance state being at least one order of magnitude higher in resistance than the low resistance state.

4. The method of claim 3, further comprising:
   measuring a collective effective resistance of the memory cells for each stored data word; and
   indicating a search match for each stored data word if the collective effective resistance is within a predetermined resistance range.

5. The method of claim 3, further comprising:
   measuring a collective current of the memory cells for each stored data word; and
   indicating a search match for each stored data word if the collective current is within a predetermined current range.

6. A computer program product embodied in a computer usable memory comprising:
   computer readable program codes coupled to the computer usable medium for operating a content addressable memory array, the computer readable program codes configured to cause the program to:
   receive a data word for storage in the content addressable memory array, each data bit of the data word being set to one of three values of a first binary value, a second binary value, and a don't care value; and
   for each data bit in the data word, program a memory element in a memory cell corresponding to the data bit to a low resistance state if a value of the data bit is the first binary value, to a high resistance state if the value of the data bit is the second binary value, and to a very high resistance state if the value of the data bit is the don't care value, the high resistance state being at least one order of magnitude higher in resistance than the low resistance state and the very high resistance state being at least one order of magnitude higher in resistance than the high resistance state.

7. The computer program product of claim 6, further comprising computer readable program codes configured to cause the program to:
   turn on an access device coupled to the memory element; and
   bias a bit line coupled to the memory element such that the current through the bit line programs the memory element to the low resistance state if the value of the corresponding data bit in the data word is the first binary value, the high resistance state if the value of the corresponding data bit in the data word is the second binary value, and the very high resistance state if the value of the corresponding data bit in the data word is the don't care value.

8. The computer program product of claim 6, further comprising computer readable program codes configured to cause the program to:
   receive a search word for search through the data words stored in the content addressable memory array, wherein bit locations of the search word correspond to bit locations of the stored data words;
   for each search bit in the search word, bias an access device electrically coupled to the memory element corresponding to the search bit to a low resistance state if a value of the search bit is the second binary value and to a high resistance state if the value of search bit is the first binary value, the high resistance state being at least one order of magnitude higher in resistance than the low resistance state.

9. The computer program product of claim 8, further comprising computer readable program codes configured to cause the program to:
measure a collective effective resistance of the memory cells for each stored data word; and
indicate a search match for each stored data word if the collective effective resistance is within a predetermined resistance range.

10. The computer program product of claim 8, further comprising computer readable program codes configured to cause the program to:
measure a collective current of the memory cells for each stored data word; and
indicate a search match for each stored data word if the collective current is within a predetermined current range.

11. A content addressable memory device comprising:
a plurality of memory cells combined to store data words, each memory cell including a memory element electrically coupled to an access device in series circuit, the memory element configured to store a first binary value as a low resistance state, a second binary value as a high resistance state, and a don't care value as a very high resistance state, the high resistance state being at least one order of magnitude higher in resistance than the low resistance state and the very high resistance state being at least one order of magnitude higher in resistance than the high resistance state; and
a search driver unit configured to, during a search operation, bias the access device of each memory cell such that the effective resistance of the access device is a low resistance state if the value of a corresponding bit of a received search word is the second binary value, and is a high resistance state if the value of the corresponding bit of the search word is the first binary value, the high resistance state being at least one order of magnitude higher in resistance than the low resistance state.

12. The content addressable memory device of claim 11, further comprising a matching unit configured to measure a collective effective resistance of the memory cells for each stored data word during the search operation and indicate a search match for each stored data word if the collective effective resistance is within a predetermined resistance range.

13. The content addressable memory device of claim 11, further comprising a matching unit configured to measure a collective current through the memory cells for each stored data word during the search operation and indicate a search match for each stored data word if the collective current is within a predetermined current range.

14. The content addressable memory device of claim 11, wherein memory elements of the same data word are electrically coupled in parallel circuit to a single bit line and access devices of the same data word are electrically coupled in parallel circuit to a single match line.

15. The content addressable memory device of claim 14, wherein the access devices in the same digit locations of data words are electrically coupled to a single word line in parallel circuit.

16. The content addressable memory device of claim 15, wherein the each bit in the data word corresponds to an individual memory cell.

17. The content addressable memory device of claim 16, further comprising:
a word decoder unit configured to, during a program operation, set the voltage in the word lines to turn on the access devices of the memory cells corresponding to the bits in the data word program the memory elements in the memory cells;
a bit decoder/data driver unit configured to, during a program operation, bias the bit lines such that the current flowing through the memory elements program the memory elements to the low resistance state if a value of the corresponding bit in the data word is the first binary value, the high resistance state if the value of the corresponding bit in the data word is the second binary value, and the very high resistance state if the value of the corresponding bit in the data word is the don't care value.

18. The content addressable memory device of claim 11, wherein the memory elements are comprised of a phase change element.

19. The content addressable memory device of claim 11, wherein the access devices are metal-oxide semiconductor field-effect transistors (MOSFET).

20. A memory cell in a content addressable memory array for storing a ternary data bit, a value of the ternary data bit being one of a first binary value, a second binary value, and a don't care value, the memory cell comprising:
a memory element configured to store a low resistance state if the value of the ternary data bit is the first binary value, a high resistance state if the value of the ternary data bit is the second binary value, and a very high resistance state if the value of the ternary data bit is the don't care value, the high resistance state being at least one order of magnitude higher in resistance than the low resistance state and the very high resistance state being at least one order of magnitude higher in resistance than the high resistance state; and
an access device electrically coupled to the memory element in series circuit.

21. The memory cell of claim 20, further comprising:
a bit line electrically coupled to the memory element; and
wherein, during a program operation, current flowing from the bit line programs the memory element to the low resistance state if the value of the ternary data bit is the first binary value, the high resistance state if the value of the ternary data bit is the second binary value, and the very high resistance state if the value of the ternary data bit is the don't care value.

22. The memory cell of claim 20, further comprising:
a bit line electrically coupled to the memory element;
a word line electrically coupled to the access device; and
a match line electrically coupled to the access device.

23. The memory cell of claim 20, wherein, during a search operation, the access device is biased such that the effective resistance of the access device is a low resistance state if a value of a search bit is the first binary value, and is a high resistance state if the value of the search bit is the second binary value, the high resistance state being at least one order of magnitude higher in resistance than the low resistance state.

24. The memory cell of claim 23, wherein a search match for the memory cell occurs if a current through the memory element and the access device in series circuit is within a predetermined current range.

25. The memory cell of claim 23, wherein a search match for the memory cell occurs if an effective resistance of the memory element in series circuit with the access device is within a predetermined resistance range.

* * * * *